(12) United States Patent
Makigawa et al.

(10) Patent No.: US 7,405,691 B2
(45) Date of Patent: Jul. 29, 2008

(54) ANALOG-TO-DIGITAL CONVERSION CIRCUIT

(75) Inventors: Kiyoshi Makigawa, Kanagawa (JP); Koichi Ono, Kanagawa (JP); Takeshi Ohkawa, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/648,544

(22) Filed: Jan. 3, 2007

(65) Prior Publication Data
US 2007/0188366 A1 Aug. 16, 2007

(30) Foreign Application Priority Data
Jan. 13, 2006 (JP) ............... 2006-006134

(51) Int. Cl.
*H03M 1/36* (2006.01)
(52) U.S. Cl. ..................... 341/159; 341/155
(58) Field of Classification Search ............. 341/159, 341/155, 156, 161
See application file for complete search history.

(56) References Cited

U.S. PATENT DOCUMENTS

| | | | | |
|---|---|---|---|---|
| 3,644,923 A | * | 2/1972 | Foerster ............ | 341/156 |
| 5,029,305 A | * | 7/1991 | Richardson ............ | 341/159 |
| 5,818,380 A | * | 10/1998 | Ito et al. ............ | 341/160 |
| 6,072,416 A | | 6/2000 | Shima | |
| 6,091,353 A | * | 7/2000 | Ariel et al. ............ | 341/159 |
| 6,407,692 B1 | | 6/2002 | Bult et al. | |
| 6,822,600 B1 | * | 11/2004 | Taft et al. ............ | 341/155 |

FOREIGN PATENT DOCUMENTS

| JP | 2000-183742 | 6/2000 |
|---|---|---|
| WO | WO 2006/000987 A1 | 1/2006 |

OTHER PUBLICATIONS

Hui Pan, "Spatial Filtering in Flash A/D Converter", IEEE Transactions on Circuts and System-II, vol. 50, pp. 424-436, Aug. 2003.
Sanroku Tsukamoto, "A CMS 6-b, 400-Msamples/s ADC with Error Correction", vol. 33, pp. 1939-1947, Dec. 1998.
EPO Search Report Dated Mar. 16, 2007; 5 pages.

* cited by examiner

*Primary Examiner*—Brian Young
(74) *Attorney, Agent, or Firm*—Rader Fishman & Grauer PLLC; Ronald P. Kananen

(57) ABSTRACT

Disclosed herein is an analog-to-digital conversion circuit configured to convert an input analog signal into a digital signal, said analog-to-digital conversion circuit includes: a first amplifying unit; a second amplifying unit; a comparing unit; a first averaging unit; a second averaging unit; and a third averaging unit.

11 Claims, 13 Drawing Sheets

ANALOG-TO-DIGITAL CONVERSION CIRCUIT

CROSS REFERENCES TO RELATED APPLICATIONS

The present invention contains subject matter related to Japanese Patent Application JP 2006-006134 filed in the Japanese Patent Office on Jan. 13, 2006, the entire contents of which being incorporated herein by reference.

BACKGROUND OF THE INVENTION

1. Field of the Invention

The present invention relates to an analog-to-digital conversion circuit configured to convert an input analog signal into a digital signal, and particularly to a parallel type analog-to-digital conversion circuit that achieves a smaller area and lower power consumption.

2. Description of the Related Art

FIG. 13 is a diagram showing an example of configuration of an ordinary parallel type analog-to-digital conversion circuit.

The analog-to-digital conversion circuit shown in FIG. 13 has a resistance ladder (R1 to R8) for generating a plurality of reference voltages, amplifier circuits A1 and A2 in two stages, master comparator latches U31 to U37 for performing comparison and determination, and an encoding circuit A3.

The amplifier circuits in the two stages amplify differences between the plurality of reference voltages generated by the resistance ladder (R1 to R8) and an analog input voltage. The master comparator latches U31 to U37 simultaneously perform comparing operation according to a clock signal CKA. Master comparator latches to which a reference voltage higher than the analog input voltage is input all generate an output having a "0" level, while master comparator latches to which a reference voltage lower than the analog input voltage is input all generate an output having a "1" level. The encoding circuit A3 performs a logical process of an exclusive disjunction of adjoining comparison outputs, converts a result of the process into a digital signal, and then outputs the digital signal. Since a sufficient gain may not-be obtained with amplifier circuits in one stage, about two amplification stages are provided in many cases.

As for example, Japanese Patent Laid-Open No. 2000-183742 relates to a parallel type analog-to-digital conversion circuit.

SUMMARY OF THE INVENTION

A parallel type analog-to-digital conversion system as described above enables high-speed processing, but requires amplifier circuits and master comparator latches corresponding to a resolution. Therefore, when the resolution is to be raised, circuit scale is increased exponentially, and power consumption and chip size are correspondingly increased. Further, when a high resolution is to be achieved, an offset between circuits becomes aggravated. Thus a range of applications of the parallel type analog-to-digital conversion system tends to be limited.

The present invention has been made in view of the above, and it is desirable to provide an analog-to-digital conversion circuit that achieves a smaller area and lower power consumption.

According to an embodiment of the present invention, there is provided an analog-to-digital conversion circuit including: a first amplifying unit supplied with an analog signal, for amplifying each of level differences between the analog signal and a plurality of reference signals, and outputting a plurality of differential signals corresponding to a result of the amplification; a second amplifying unit for amplifying each of the plurality of differential signals output from the first amplifying unit, and outputting a plurality of differential signals corresponding to a result of the amplification; a comparing unit for comparing each pair of signals of the plurality of differential signals output from the second amplifying unit with each other, and outputting a plurality of binary signals corresponding to a result of the comparison; a first averaging unit including a plurality of averaging resistive elements for connection between output terminals of the first amplifying unit; a second averaging unit including a plurality of averaging resistive elements for connection between output terminals of the second amplifying unit; and a third averaging unit for performing an averaging process by majority logic operation on each of the plurality of binary signals output from the comparing unit with a predetermined number of other binary signals.

Preferably, at least one of the first amplifying unit and the second amplifying unit includes: a differential amplifier circuit for amplifying an input differential signal; and a voltage follower circuit to which the differential signal output from the differential amplifier circuit is input, and which outputs a differential voltage corresponding to a voltage difference of the input differential signal to an output terminal.

In addition, preferably, an impedance ratio between an output impedance of the voltage follower circuit and a resistance value of a resistive element connected to the voltage follower circuit via the output terminal has a predetermined value.

According to another embodiment of the present invention, the output terminals are connected to each other by the averaging resistive elements in each of the stages of the first amplifying unit and the second amplifying unit, and further the averaging process by majority logic operation is performed in a binary signal stage. It is thereby possible to reduce offset variations even when the size of circuit elements is relatively small, and thus achieve a smaller area and lower power consumption.

The above and other features and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

First Embodiment

Figure 1:
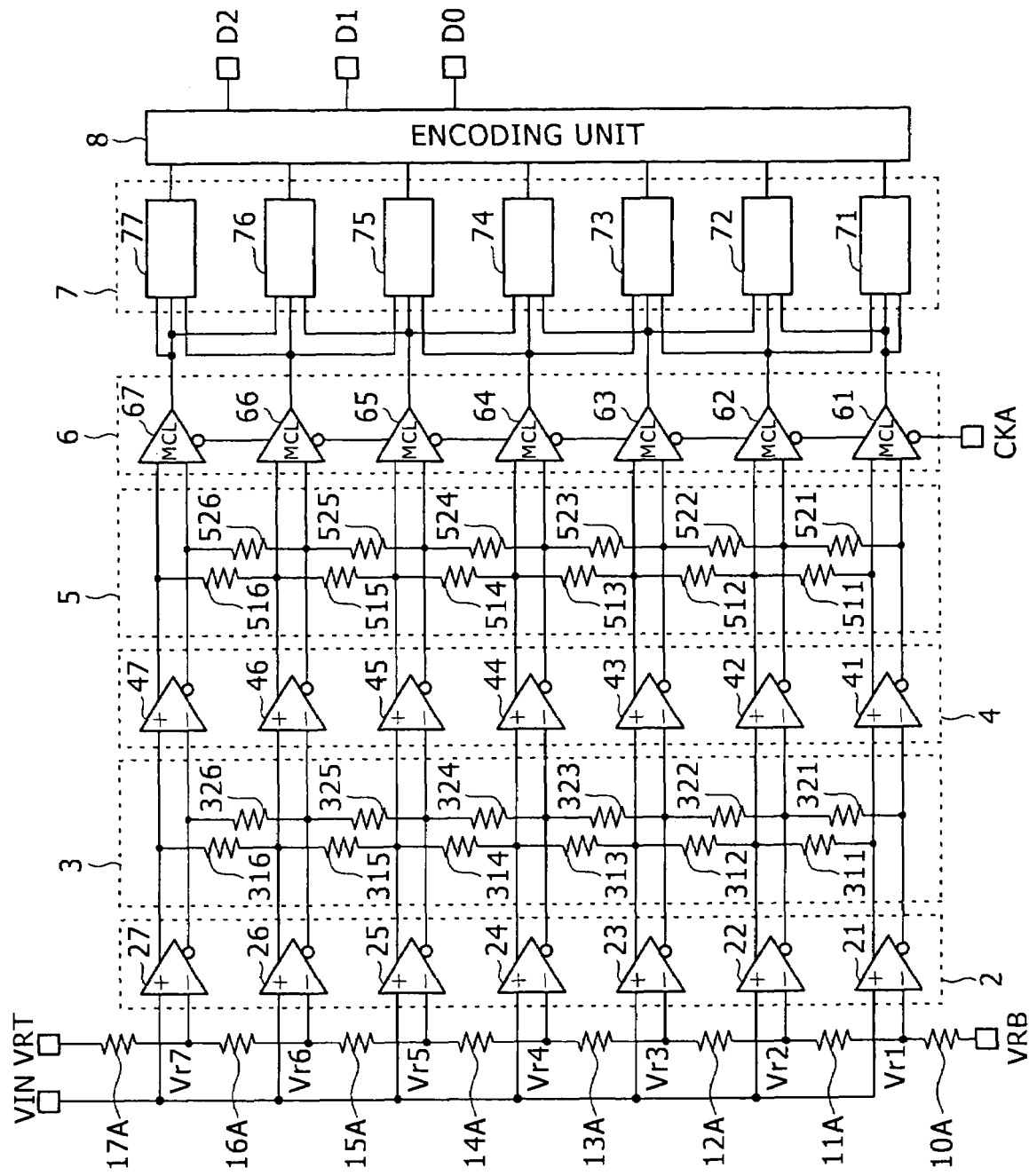
FIG. 1 is a diagram showing an example of configuration of a three-bit analog-to-digital conversion circuit according to a first embodiment of the present invention.

FIG. 1 is a diagram showing an example of configuration of a three-bit analog-to-digital conversion circuit according to a first embodiment of the present invention.

The analog-to-digital conversion circuit shown in FIG. 1 includes resistive elements 10A to 17A for generating reference voltages, a first amplifying unit 2, a first averaging unit 3, a second amplifying unit 4, a second averaging unit 5, a comparing unit 6, a third averaging unit 7, and an encoding unit 8.

The first amplifying unit 2 is an embodiment of a first amplifying unit according to the present invention.

The second amplifying unit 4 is an embodiment of a second amplifying unit according to the present invention.

The first averaging unit 3 is an embodiment of a first averaging unit according to the present invention.

The second averaging unit 5 is an embodiment of a second averaging unit according to the present invention.

The comparing unit 6 is an embodiment of a comparing unit according to the present invention.

The third averaging unit 7 is an embodiment of a third averaging unit according to the present invention.

The resistive elements 10A to 17A are connected in series with each other in order of reference numeral number. A reference voltage VRB is applied to an end part on the side of the resistive element 10A in the series connection circuit, and a reference voltage VRT higher than the reference voltage VRB is applied to an end part on the side of the resistive element 17A.

Reference voltages Vr1, Vr2, . . . , and Vr7 are generated in order from a low voltage side at respective points of connection between the resistive elements 10A to 17A.

The first amplifying unit 2 amplifies each of voltage differences between an input voltage VIN and the reference voltages Vr1 to Vr7, and then outputs each differential signal corresponding to a result of the amplification.

As shown in FIG. 1, the first amplifying unit 2 has amplifier circuits 21 to 27 for performing differential signal amplification.

The amplifier circuit 2$i$ (i denotes an integer of one to seven, and the same applies in the following) amplifies a difference between the reference voltage Vri and the input voltage VIN, and then outputs a result of the amplification as differential voltage.

The first averaging unit 3 is a circuit for reducing an offset of the first amplifying unit 2 by averaging the voltage of each differential signal output from the first amplifying unit 2 in an analog manner. The first averaging unit 3 has averaging resistive elements 311 to 316 and 321 to 326 for connection between output terminals of the first amplifying unit 2.

The averaging resistive element 31$j$ (j denotes an integer of one to six, and the same applies in the following) is connected between positive output terminals of an amplifier circuit 2$j$ and an amplifier circuit 2(j+1). The averaging resistive element 32$j$ is connected between negative output terminals of the amplifier circuit 2$j$ and the amplifier circuit 2(j+1).

The above connection relation can be expressed in other words as follows.

When the seven amplifier circuits 21 to 27 are ordered according to the level of the input voltage VIN that causes polarity inversion in differential signals of outputs of the amplifier circuits, the order is the amplifier circuits 21, 22, 23, . . . , and 27 in order of reference numeral number. The averaging resistive element 31$j$ is connected between the positive output terminals of the amplifier circuit 2$j$ and the amplifier circuit 2(j+1) adjacent to each other in this order. The averaging resistive element 32$j$ is similarly connected between the negative output terminals of the amplifier circuit 2$j$ and the amplifier circuit 2(j+1) adjacent to each other.

Figure 2A:
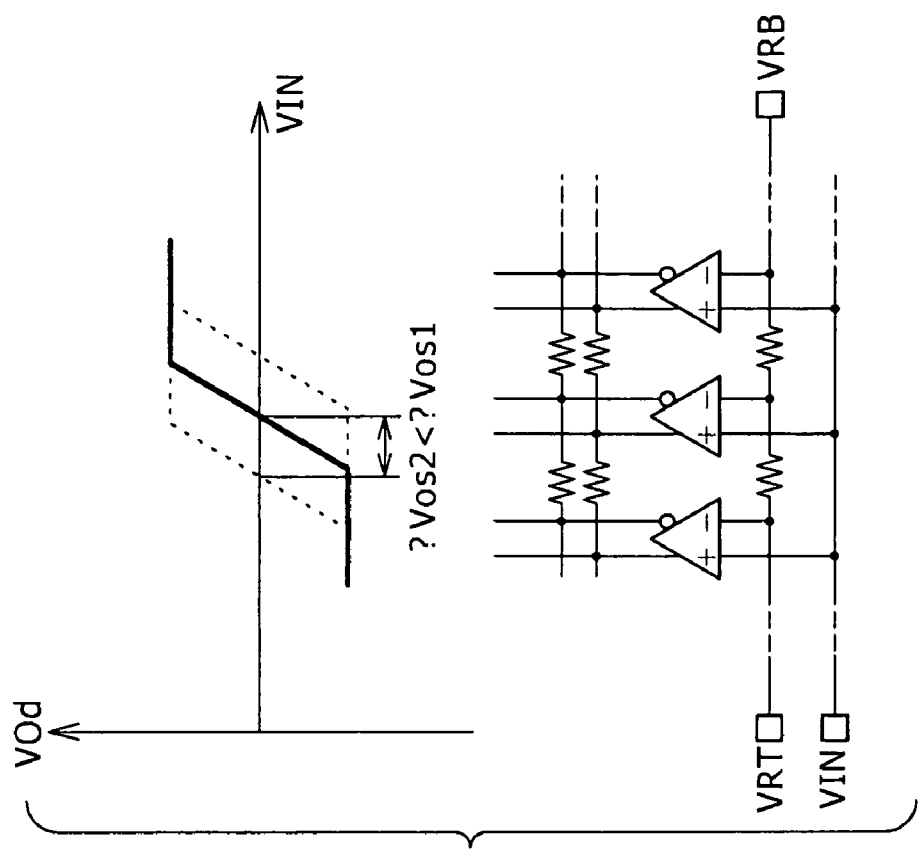
FIGS. 2A and 2B are diagrams of assistance in explaining reduction of an offset of a first amplifying unit as a result of an averaging effect of a first averaging unit.
Figure 2B:
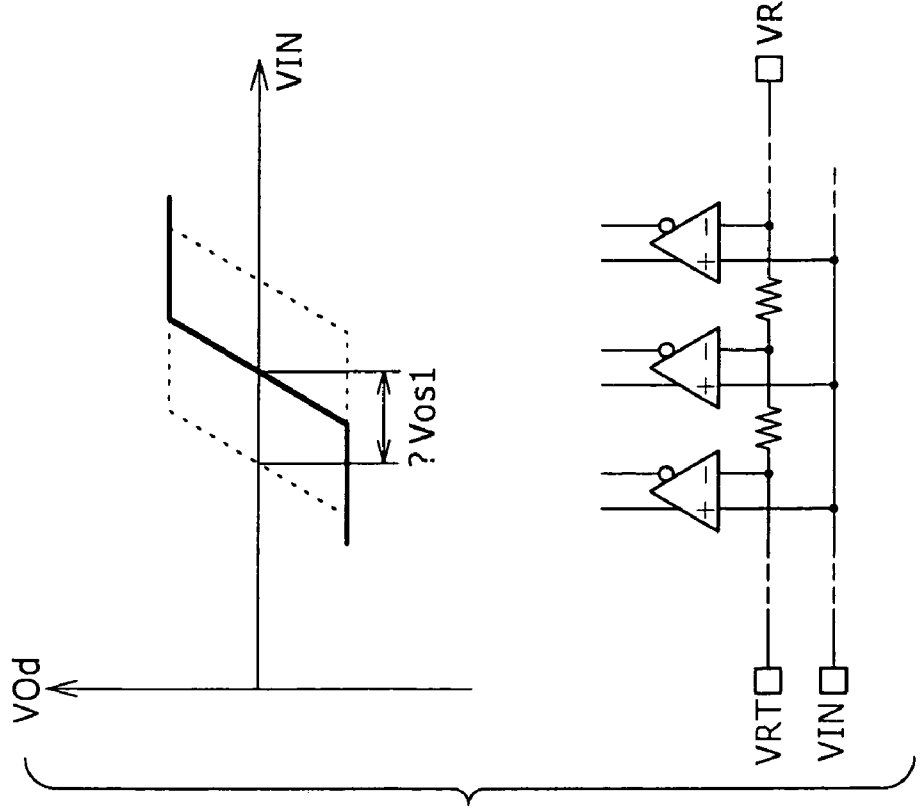

FIGS. 2A and 2B are diagrams of assistance in explaining reduction of an offset of the first amplifying unit 2 as a result of an averaging effect of the first averaging unit 3.

As a technique for easing accuracy requirements for a circuit and reducing the area of circuit elements, there is a method referred to as averaging (see Non-Patent Document 1 "Hui Pan, 'Spatial Filtering in Flash A/D Converters', IEEE Transactions on Circuits and Systems-II, vol. 50, pp. 424 to 436, August 2003", for example).

Suppose that as shown in FIG. 2A, the first amplifying unit 2 has caused an offset voltage $\Delta$Vos1 due to variations caused by element characteristic matching. With the configuration of the first amplifying unit 2 unchanged, when averaging resistive elements are inserted between adjacent outputs as shown in FIG. 2B, an offset voltage $\Delta$Vos2 of the first amplifying unit 2 is averaged, and the value of the offset voltage $\Delta$Vos2 is lower than the original offset voltage $\Delta$Vos1. When the offset voltage becomes lower, high-precision signal processing can be performed in a smaller area. It is therefore possible to decrease an overall element area, and reduce power consumption and area.

Figure 3:
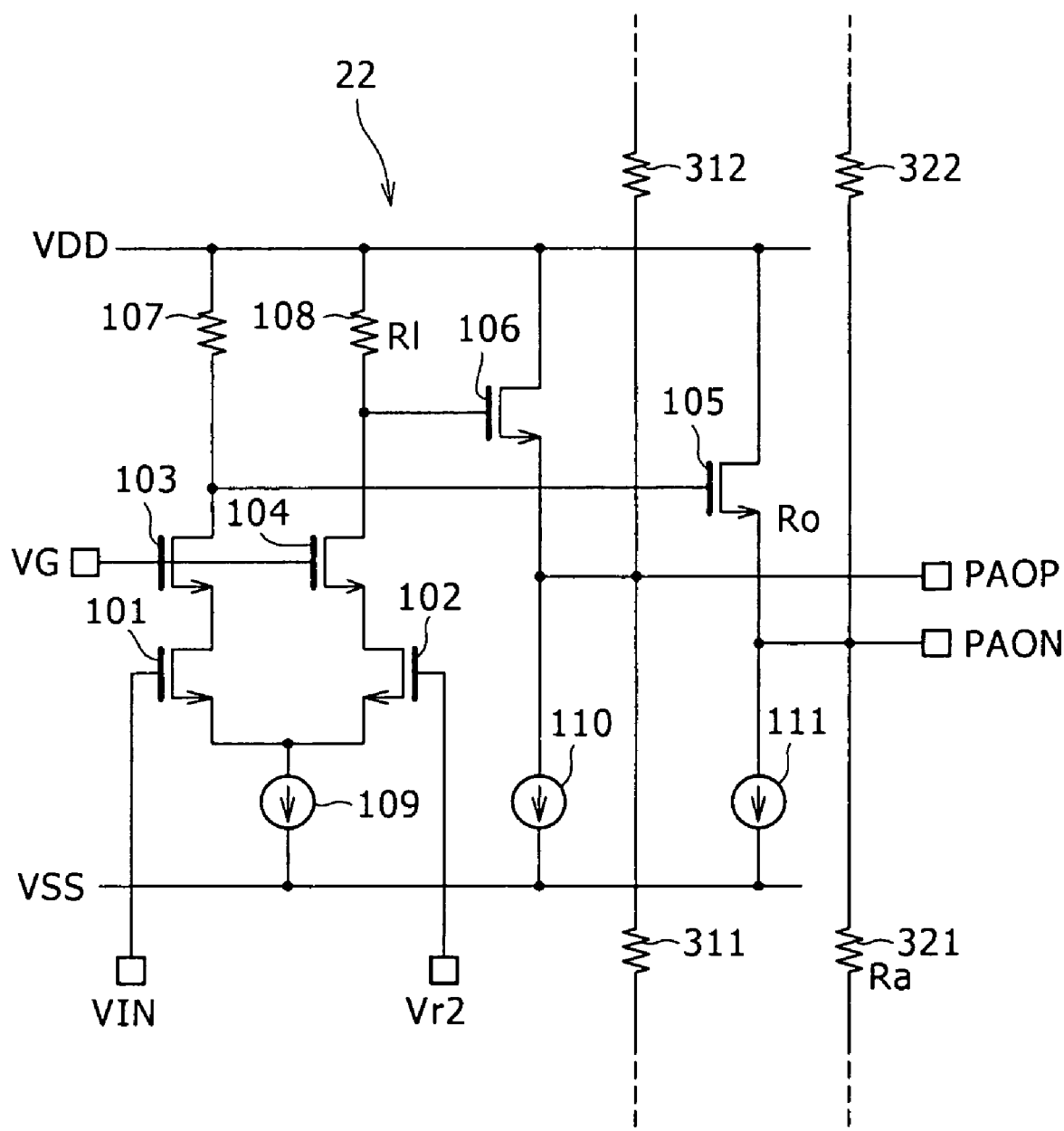
FIG. 3 is a diagram showing an example of configuration of an amplifier circuit performing differential signal amplification in the first amplifying unit.

FIG. 3 is a diagram showing an example of configuration of an amplifier circuit 22 performing differential signal amplification in the first amplifying unit 2. The other amplifier circuits (21 and 23 to 27) in the first amplifying unit 2 have a similar configuration to the configuration of the amplifier circuit 22.

The amplifier circuit 22 shown in FIG. 3 has n-type MOS transistors 101 to 106, resistive elements 107 and 108, and constant-current circuits 109 to 111.

A circuit including the MOS transistors 101 to 104 and the resistive elements 107 and 108 is an embodiment of a differential amplifier circuit according to the present invention.

A circuit including the MOS transistors 105 and 106 and the constant-current circuits 110 and 111 is an embodiment of a voltage follower circuit according to the present invention.

The MOS transistors 101 and 102 have respective sources connected to a common node. The sources are connected to a reference potential VSS via the constant-current circuit 109.

The drain of the MOS transistor 101 is connected to the source of the MOS transistor 103. The input voltage VIN is applied to the gate of the MOS transistor 101. The drain of the MOS transistor 102 is connected to the source of the MOS transistor 104. The reference voltage Vr2 is applied to the gate of the MOS transistor 102.

The drain of the MOS transistor 103 is connected to a power supply voltage VDD via the resistive element 107, and is also connected to the gate of the MOS transistor 105. The drain of the MOS transistor 104 is connected to the power supply voltage VDD via the resistive element 108, and is also connected to the gate of the MOS transistor 106. A predetermined bias voltage VG is applied to the gates of the MOS transistors 103 and 104.

The drain of the MOS transistor 105 is connected to the power supply voltage VDD. The source of the MOS transistor 105 is connected to the reference potential VSS via the constant-current circuit 111. The drain of the MOS transistor 106 is connected to the power supply voltage VDD. The source of the MOS transistor 106 is connected to the reference potential VSS via the constant-current circuit 110.

A voltage occurring at a point of connection between the MOS transistor 106 and the constant-current circuit 110 is output to a positive output terminal PAOP of the amplifier circuit 22. A voltage occurring at a point of connection between the MOS transistor 105 and the constant-current circuit 111 is output to a negative output terminal PAON of the amplifier circuit 22.

The MOS transistors 101 to 104 and the resistive elements 107 and 108 form a differential amplifier circuit. This differential amplifier circuit amplifies a difference between the input voltage VIN and the reference voltage Vr2, and generates a result of the amplification as differential voltage between the drains of the MOS transistors 103 and 104.

The MOS transistor 105 and the constant-current circuit 111 form a source follower circuit. The voltage of the source of the MOS transistor 105 (that is, the negative output-terminal PAON of the amplifier circuit 22) is made to follow the gate voltage of the MOS transistor 105. The MOS transistor 106 and the constant-current circuit 110 similarly form a source follower circuit. The voltage of the source of the MOS transistor 106 (that is, the positive output terminal PAOP of the amplifier circuit 22) is made to follow the gate voltage of the MOS transistor 106.

Thus, differential voltages resulting from the amplification of the difference between the input voltage VIN and the reference voltage Vr2 are output to the output terminals (PAOP and PAON) of the amplifier circuit 22.

As shown in FIG. 3, the amplifier circuit 22 has the source follower circuits (105 and 111 and 106 and 110) in an output stage of the amplifier circuit 22.

In the present embodiment, a ratio (Ra/Ro) between the output impedance Ro of the source follower circuits and the resistance value Ra of the averaging resistive elements (311, 312 . . . ) is set to a predetermined value (for example "0.1").

As shown in Non-Patent Document 1, it is known that favorable averaging effects are generally obtained by setting the ratio between the output impedance of the amplifier circuit and the resistance value of the averaging resistive elements to about 0.1.

Figure 4:
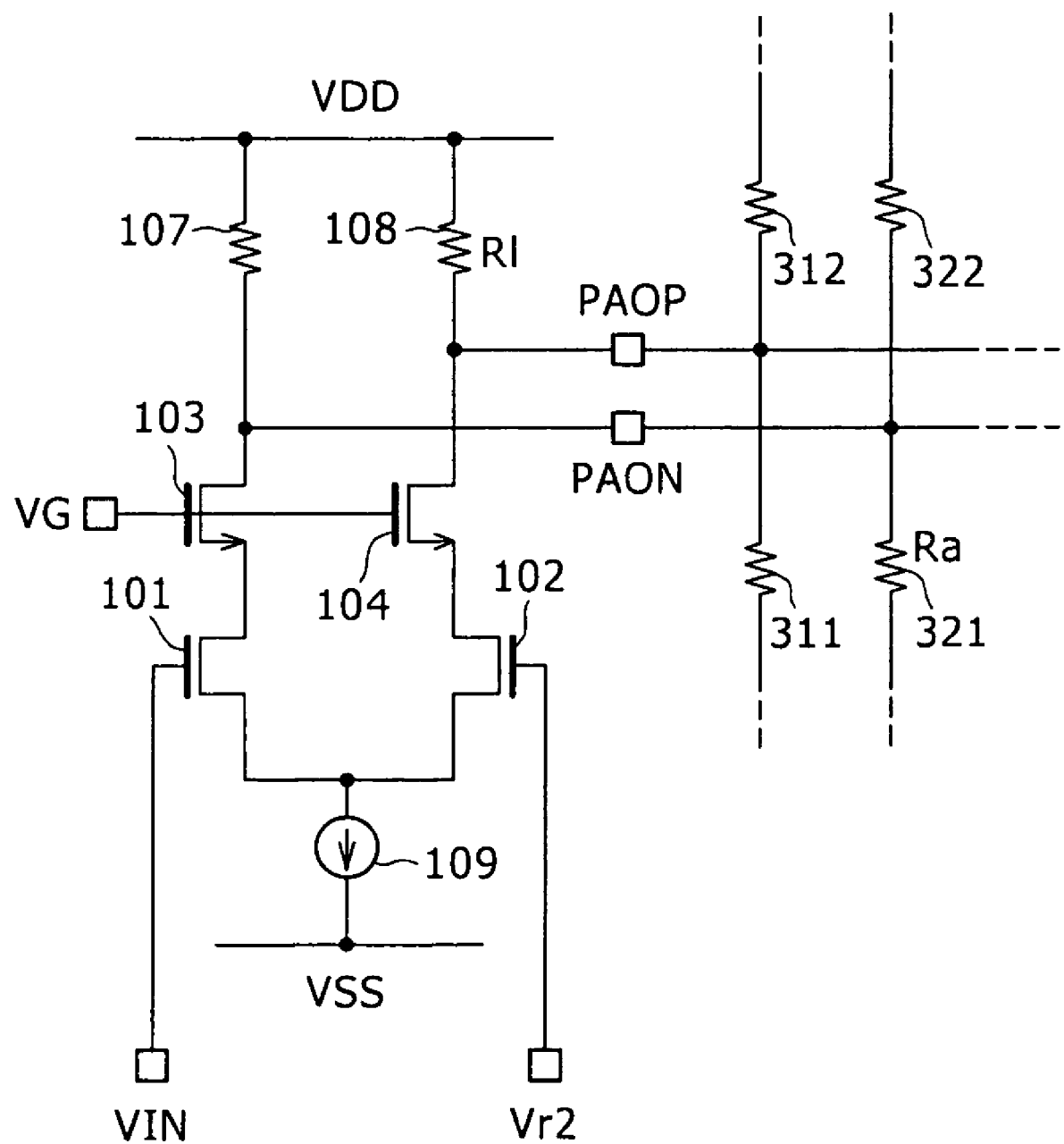
FIG. 4 is a diagram showing an instance of the amplifier circuit shown in FIG. 3 from which source follower circuits in an output stage are omitted.

FIG. 4 is a diagram showing an instance of the amplifier circuit shown in FIG. 3 from which the source follower circuits in the output stage are omitted.

In the instance shown in FIG. 4, the output impedance of the amplifier circuit is the resistance value Rl of the resistive elements 107 and 108. Hence, when the above-described impedance ratio (Ra/Rl=0.1) is to be satisfied, the resistance value Rl is limited by the resistance value Ra. The resistance value Rl is related to the gain of the differential amplifier circuit (101 to 104 and 107 to 109). The gain can be raised as the resistance value Rl is increased. However, when the range of the resistance value Ra is limited, the resistance value Rl may not be increased very much, so that a desired gain may not be obtained.

On the other hand, the amplifier circuit 22 shown in FIG. 3 is provided with the source follower circuits in the output stage, so that the resistance value Rl of the resistive elements 107 and 108 can be set independently of the resistance value Ra of the averaging resistive elements. It is therefore possible to prevent a decrease in gain of the differential amplifier circuit in a first stage (101 to 104 and 107 to 109) while maintaining the above-described suitable impedance ratio (Ra/Ro=0.1).

That is, by setting the suitable impedance ratio (Ra/Ro=0.1), it is possible to reduce the offset and improve conversion accuracy, and raise the gain of the differential amplifier circuit in the first stage (101 to 104 and 107 to 109) and increase operating speed.

Description will return to FIG. 1.

The second amplifying unit 4 further amplifies each differential signal output from the first amplifying unit 2, and then outputs each differential signal corresponding to a result of the amplification.

Similarly to the first amplifying unit 2, the second amplifying unit 4 has seven amplifier circuits 41 to 47 for performing differential signal amplification.

The amplifier circuit 4i (i=1 to 7) amplifies the differential signal output from the amplifier circuit 2i in the first amplifying unit 2, and then outputs a result of the amplification as differential signal. The amplifier circuit 4i has the same configuration as the amplifier circuit 22 shown in FIG. 3.

The second averaging unit 5 is a circuit for reducing an offset of the second amplifying unit 4 by averaging the voltage of each differential signal output from the second amplifying unit 4 in an analog manner. The second averaging unit 5 has averaging resistive elements 511 to 516 and 521 to 526 for connection between output terminals of the second amplifying unit 4.

The averaging resistive element 51$j$ (j=1 to 6) is connected between positive output terminals of an amplifier circuit 4$j$ and an amplifier circuit 4(j+1). The averaging resistive element 52$j$ is connected between negative output terminals of the amplifier circuit 4$j$ and the amplifier circuit 4(j+1).

The above connection relation can be expressed in other words as follows.

When the seven amplifier circuits 41 to 47 are ordered according to the level of the input voltage VIN that causes polarity inversion in differential signals of outputs of the amplifier circuits, the order is the amplifier circuits 41, 42, 43, . . . , and 47 in order of reference numeral number. The averaging resistive element 51$j$ is connected between the positive output terminals of the amplifier circuit 4$j$ and the amplifier circuit 4(j+1) adjacent to each other in this order. The averaging resistive element 52$j$ is similarly connected between the negative output terminals of the amplifier circuit 4$j$ and the amplifier circuit 4(j+1) adjacent to each other.

By connecting the respective output terminals of the adjacent amplifier circuits 41 to 47 by the averaging resistive elements (511 to 516 and 521 to 526), it is possible to average and reduce the offset voltage of the amplifier circuits 41 to 47, which offset voltage is caused by an element mismatch, in an analog manner as in the first amplifying unit 2.

The comparing unit 6 compares each pair of signals of the differential signals output from the second amplifying unit 4 with each other, and then outputs a seven-bit binary signal corresponding to a result of the comparison.

In the example of FIG. 1, the comparing unit 6 has master comparator latches (MCLs) 61 to 67. The MCL 6i (i=1 to 7) compares a pair of signals of the differential signal output form the amplifier circuit 4i with each other in synchronism with a clock signal CKA, and retains (latches) a binary signal corresponding to a result of the comparison.

The third averaging unit 7 subjects each of the binary signals output from the MCLs 61 to 67 of the comparing unit 6 to an averaging process by majority logic operation with two other binary signals output from the MCLs 61 to 67.

The third averaging unit 7 in the example of FIG. 1 has seven majority logic circuits 71 to 77. The majority logic circuit 7k (k denotes an integer of two to six, and the same applies in the following) performs majority logic operation on the three binary signals output from the MCLs 6(k−1), 6k, and 6(k+1). The majority logic circuit 71 performs majority logic operation on the two binary signals output from the MCLs 61 and 62 (the binary signal output from the MCL 61 is regarded as two signals). The majority logic circuit 77 performs majority logic operation on the two binary signals output from the MCLs 66 and 67 (the binary signal output from the MCL 67 is regarded as two signals).

The above-described operation of the third averaging unit 7 can be expressed in other words as follows.

When the MCLs 61 to 67 of the comparing unit 6 are ordered according to the level of the input voltage VIN that causes logical inversion in the outputs of the MCLs, the order is the MCLs 61, . . . , and 67 in order of reference numeral number. The third averaging unit 7 performs majority logic operation on a set of three binary signals adjacent to each other in this order.

Figure 5:
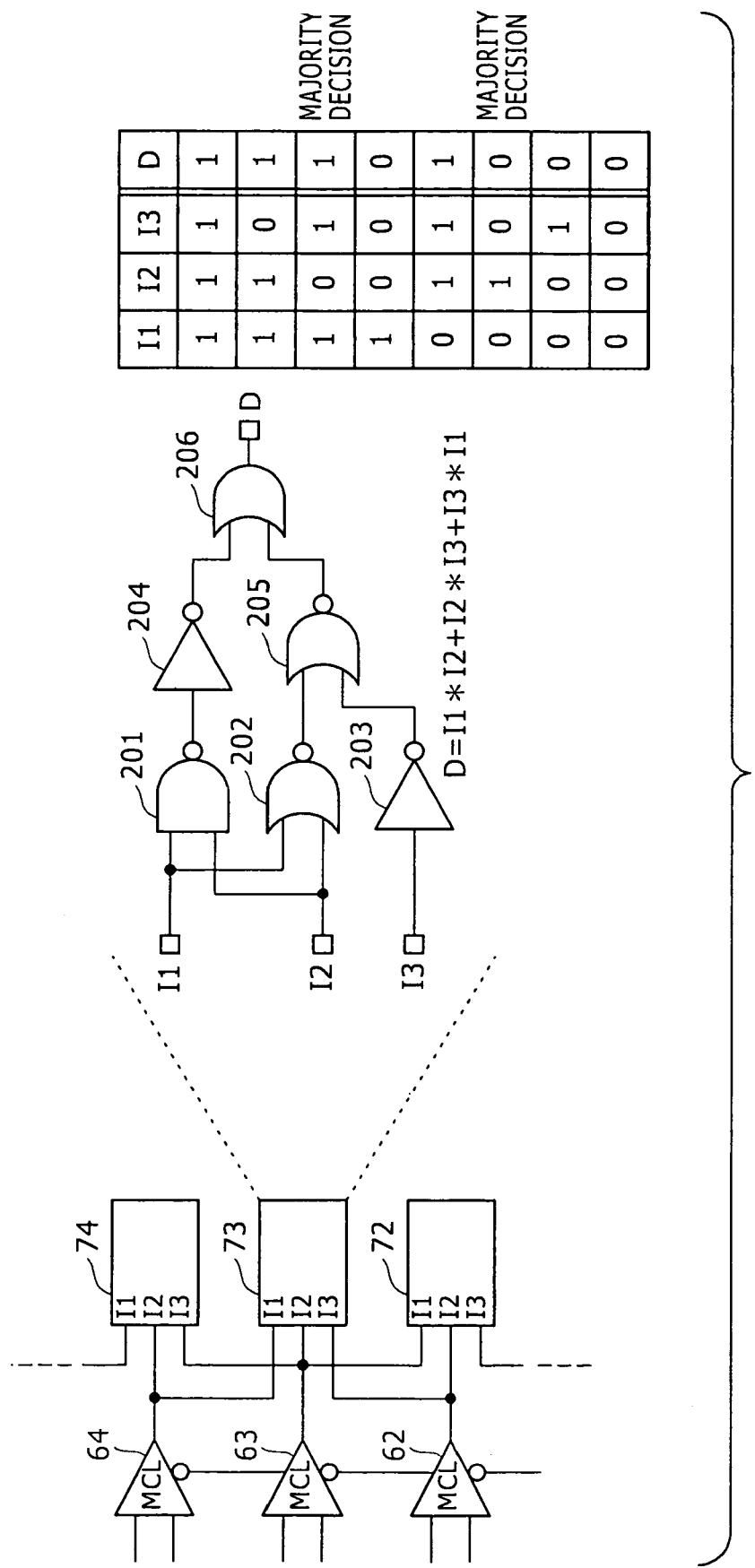
FIG. 5 is a diagram showing an example of configuration of a majority logic circuit in a third averaging unit.

FIG. 5 is a diagram showing an example of configuration of the majority logic circuit 73 in the third averaging unit 7. The other majority logic circuits (71, 72, and 74 to 77) have a similar configuration.

The majority logic circuit 73 shown in FIG. 5 has a NAND circuit 201, NOR circuits 202 and 205, an OR circuit 206, NOT circuits 203 and 204, and input terminals I1 to I3.

The output signals of the MCLs 64, 63, and 62 are input to the input terminals I1, I2, and I3, respectively. The NAND circuit 201 performs a NAND operation on the signals input to the input terminals I1 and I2. The NOR circuit 202 performs a NOR operation on the signals input to the input terminals I1 and I2. The NOT circuit 203 logically inverses the signal input to the input terminal I3. The NOT circuit 204 logically inverses an output of the NAND circuit 201. The NOR circuit 205 performs NOR operation on outputs of the NOR circuit 202 and the NOT circuit 203. The OR circuit 206 performs OR operation on outputs of the NOT circuit 204 and the NOR circuit 205, and then outputs a signal D as a result of the majority logic operation.

Letting "I1", "I2", and "I3" be the logical values of the signals input to the input terminals I1, I2, and I3, I1, I2, and I3 have values shown in a truth table in FIG. 5. The signal D is expressed by the following logical equation.

[Equation 1]

$$D = I1*I2 + I2*I3 + I3*I1 \quad (1)$$

As shown in the truth table in FIG. 5, the value of the signal D is basically equal to "I2". As exceptions, however, "D=1" when "I1=1", "I2=0", and "I3=1", and "D=0" when "I1=0", "I2=1", and "I3=0".

When the output signals of the MCLs are averaged by majority logic with adjacent signals, the output results of the MCLs including an error referred to as a bubble error can be corrected (see for example, "Sanroku Tsukamoto, 'A CMOS 6-b, 400-MSample/s ADC with Error Correction', vol. 33, pp. 1939 to 1947, December 1998").

The encoding unit 8 converts the seven-bit binary signal resulting from the averaging process by majority logic in the third averaging unit 7 into a three-bit digital signal, and then outputs the three-bit digital signal.

The operation of the analog-to-digital conversion circuit shown in FIG. 1 which circuit has the above-described configuration will be described in the following.

First, in the first amplifying unit 2, differences between the seven reference voltages (Vr1 to Vr7) and the input voltage VIN are amplified, and the differential signals are each further amplified in the second amplifying unit 4 and then input to the comparing unit 6. The comparing unit 6 compares a pair of signals of each of the differential signals output from the second amplifying unit 4 with each other, and then outputs a seven-bit binary signal corresponding to a result of the comparison. This seven-bit binary signal is subjected to the averaging process by majority logic with adjacent binary signals in the third averaging unit 7, and is thereafter converted into a three-bit digital signal in the encoding unit 8.

As described above, in the analog-to-digital conversion circuit according to the present embodiment, the output terminals in the respective stages of the first amplifying unit 2 and the second amplifying unit 4 are connected to each other by the averaging resistive elements, and further the binary signal output from the comparing unit 6 is subjected to the averaging process by majority logic operation. It is thereby possible to reduce offset variations even when the size of circuit elements is relatively small, and thus achieve a smaller area and lower power consumption.

That is, the present embodiment is provided with a total of three stages of averaging circuits at the output parts of the first amplifying unit 2, the second amplifying unit 4, and the comparing unit 6, so that an offset occurring at each output part can be reduced effectively. Thus, each elemental circuit can be formed by a circuit element (a transistor or the like) of a relatively small size. It is therefore possible to achieve a smaller area and lower power consumption.

Further, by providing a source follower circuit (voltage follower circuit) in the output stages of the first amplifying unit 2 and the second amplifying unit 4, and setting the ratio between the output impedance Ro of the source follower circuits and the resistance value Ra of the averaging resistive elements to a predetermined value (for example Ra/Ro=0.1), it is possible to enhance the averaging effect of the first averaging unit 3 and the second averaging unit 5, and thus improve accuracy.

In addition, in this case, the voltage follower circuit provided in the output stages of the first amplifying unit 2 and the second amplifying unit 4 makes it possible to set the above impedance ratio without lowering the gain of the first stage (differential amplifier circuit) of the first amplifying unit 2 and the second amplifying unit 4, and increase operating speed.

Second Embodiment

A second embodiment of the present invention will next be described.

An analog-to-digital conversion circuit according to the second embodiment is provided with a folder circuit and an interpolating circuit.

Figure 6:
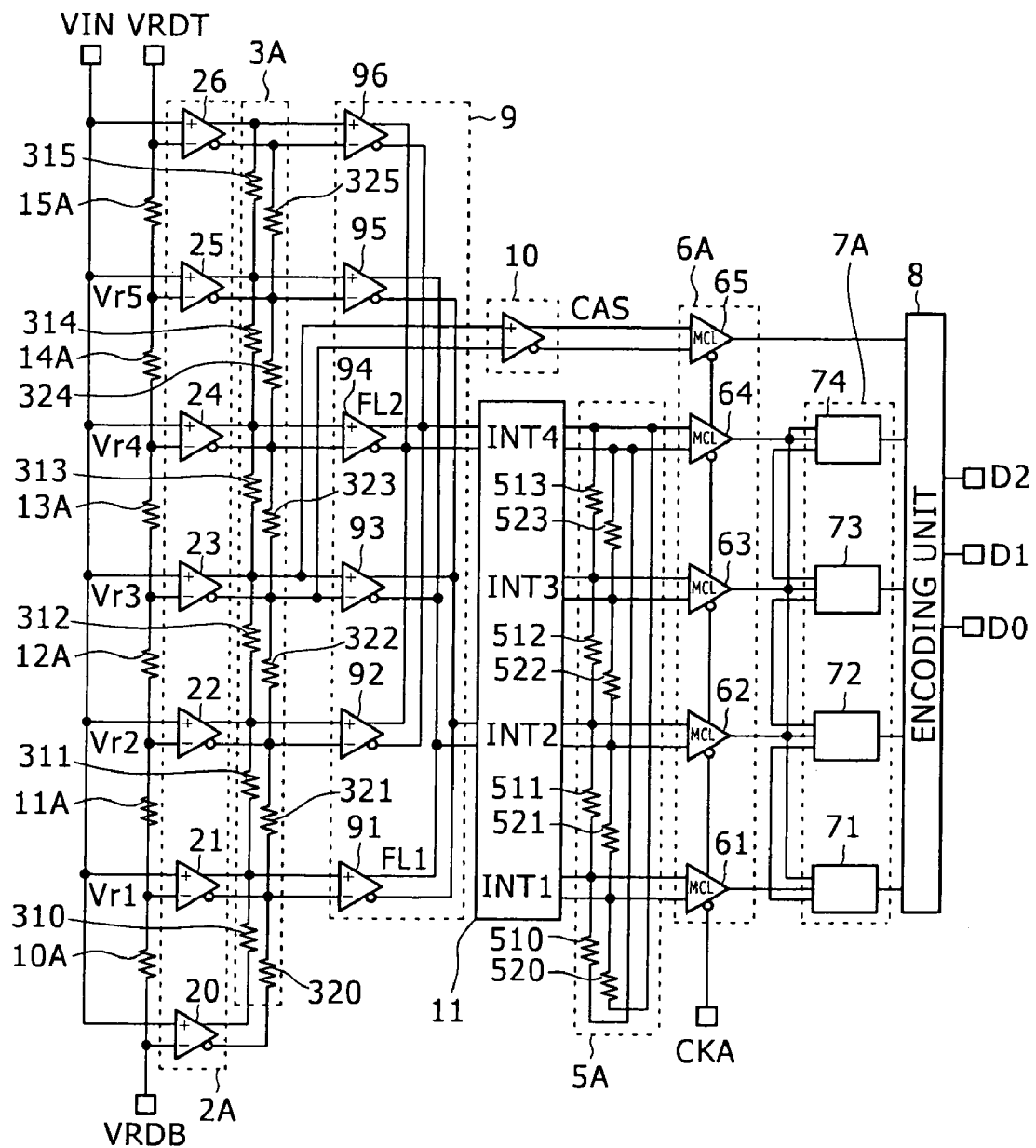
FIG. 6 is a diagram showing an example of configuration of a three-bit analog-to-digital conversion circuit according to a second embodiment of the present invention.

FIG. 6 is a diagram showing an example of configuration of the three-bit analog-to-digital conversion circuit according to the second embodiment of the present invention.

The analog-to-digital conversion circuit shown in FIG. 6 has resistive elements 10A to 15A for generating reference voltages, a first amplifying unit 2A, a first averaging unit 3A, a folder circuit 9, a coarse amplifier 10, an interpolating circuit 11, a second averaging unit 5A, a comparing unit 6A, a third averaging unit 7A, and an encoding unit 8.

The first amplifying unit 2A is an embodiment of a first amplifying unit according to the present invention.

The folder circuit 9 is an embodiment of a folder circuit according to the present invention.

The coarse amplifier 10 is an embodiment of a first differential amplifier circuit according to the present invention.

The interpolating circuit 11 is an embodiment of an interpolating circuit according to the present invention.

The first averaging unit 3A is an embodiment of a first averaging unit according to the present invention.

The second averaging unit 5A is an embodiment of a second averaging unit according to the present invention.

The comparing unit 6A is an embodiment of a comparing unit according to the present invention.

The third averaging unit 7A is an embodiment of a third averaging unit according to the present invention.

The resistive elements 10A to 15A are connected in series with each other in order of reference numeral number. A reference voltage VRDB is applied to an end part on the side of the resistive element 10A in the series connection circuit, and a reference voltage VRDT higher than the reference voltage VRDB is applied to an end part on the side of the resistive element 15A.

Reference voltages Vr1, Vr2, . . . , and Vr5 are generated in order from a low voltage side at respective points of connection between the resistive elements 10A to 15A.

The first amplifying unit 2A amplifies each of voltage differences between an input voltage VIN and the reference voltages Vr1, Vr2, . . . , and Vr5, and then outputs each differential signal corresponding to a result of the amplification.

As shown in FIG. 6, for example, the first amplifying unit 2A has amplifier circuits 21 to 25 for performing differential signal amplification.

The amplifier circuit 2n (n denotes an integer of one to five, and the same applies in the following) amplifies a difference between the reference voltage Vrn and the input voltage VIN, and then outputs a result of the amplification as differential voltage. The amplifier circuit 2n has a similar configuration to that of the amplifier circuit 22 shown in FIG. 3.

The first amplifying unit 2A also has amplifier circuits 20 and 26 for generating a dummy bit signal used in an averaging process of the first averaging unit 3A.

The amplifier circuit 20 amplifies a difference between the input voltage VIN and the reference voltage VRDB, and then outputs a result of the amplification as differential voltage. The amplifier circuit 26 amplifies a difference between the input voltage VIN and the reference voltage VRDT, and then outputs a result of the amplification as differential voltage. The amplifier circuits 20 and 26 also have a similar configuration to that of the amplifier circuit 22 shown in FIG. 3.

As with the above-described first averaging unit 3, the first averaging unit 3A reduces an offset of the first amplifying unit 2A by averaging the voltage of each differential signal output from the first amplifying unit 2A in an analog manner. The first averaging unit 3A has averaging resistive elements 310 to 315 and 320 to 325 for connection between output terminals of the first amplifying unit 2A.

The averaging resistive element 31m (m denotes an integer of zero to five, and the same applies in the following) is connected between positive output terminals of an amplifier circuit 2m and an amplifier circuit 2(m+1). The averaging resistive element 32m is connected between negative output terminals of the amplifier circuit 2m and the amplifier circuit 2(m+1).

When averaging is performed by connecting the averaging resistive elements between the output terminals of the amplifier circuits, a shift may occur in determination voltage around both ends of a full scale. In order to prevent this shift, the analog-to-digital conversion circuit shown in FIG. 6 has an extended full scale, and is provided with the amplifier circuits 20 and 26 for dummy bits on a low voltage side and a high voltage side, respectively. By supplying the differential voltages output by the amplifier circuits 20 and 26 for dummy bits to the output terminals of the amplifier circuits 21 and 25 through averaging resistive elements, it is possible to suppress a decrease in accuracy around both ends of the full scale. While there are two amplifier circuits for dummy bits in the example of FIG. 6, the number of amplifier circuits in the first stage, a voltage difference between the reference voltages VRDT and VRDB, and the number of resistive elements for generating reference voltages can be increased according to required accuracy.

The coarse amplifier 10 amplifies an output signal of the first amplifying unit 2A which signal is related to a most significant bit D2 of a three-bit digital signal output from the encoding unit 8. The most significant bit D2 is inverted from "0" to "1" when the input voltage VIN reaches half the full scale. A signal inverted under the same condition is an output signal of the amplifier circuit 23 that amplifies a difference between the reference voltage Vr3 corresponding to a middle point of the full scale and the input voltage VIN. Thus, the coarse amplifier 10 amplifies the output signal of the differential amplifier circuit 23.

The folder circuit 9 has amplifier circuits (second differential amplifier circuits) 91 to 96 for amplifying respective outputs of the amplifier circuits 21 to 26 in the first amplifying unit 2A. The folder circuit 9 synthesizes the differential signals output from the amplifier circuits 91 to 96 in predetermined combinations, and thereby generates folding signals FL1 and FL2 in which the polarity of the differential signal is inverted at different levels of the input voltage VIN.

The folder circuit 9 shown in the example of FIG. 6 generates the folding signal FL1 by synthesizing the outputs of the amplifier circuits 91, 93, and 95. Specifically, the negative output terminals of the amplifier circuits 91 and 95 and the positive output terminal of the amplifier circuit 93 are connected to each other to generate one signal FL1P of the folding signal FL1. The positive output terminals of the amplifier circuits 91 and 95 and the negative output terminal of the amplifier circuit 93 are connected to each other to generate another signal FL1N of the folding signal FL1.

Figure 8A:
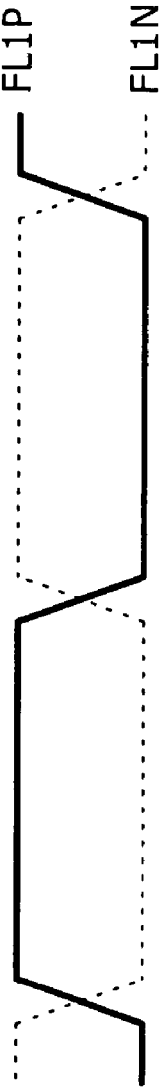
FIGS. 8A, 8B, 8C, 8D, 8E, 8F, and 8G are diagrams showing an example of waveforms of input and output signals of the interpolating circuit shown in FIG. 7 and an output signal of a coarse amplifier.

FIG. 8A shows an example of waveforms of the folding signal FL1. As shown in this figure, the polarity of the differential signal is inverted in the waveforms of the folding signal FL1 when the input voltage VIN coincides with the reference voltage Vr1, Vr3, or Vr5.

In addition, the folder circuit 9 shown in the example of FIG. 6 generates the folding signal FL2 by synthesizing the outputs of the amplifier circuits 92, 94, and 96. Specifically, the negative output terminals of the amplifier circuits 92 and 96 and the positive output terminal of the amplifier circuit 94 are connected to each other to generate one signal FL2P of the folding signal FL2. The positive output terminals of the amplifier circuits 92 and 96 and the negative output terminal of the amplifier circuit 94 are connected to each other to generate another signal FL2N of the folding signal FL2.

The folder circuit is generally formed by an odd number of amplifier circuits for adjustment of an operating point of the folding signals. Therefore the folder circuit 9 in the example of FIG. 6 uses the output of the dummy bit amplifier circuit 96.

Figure 8B:
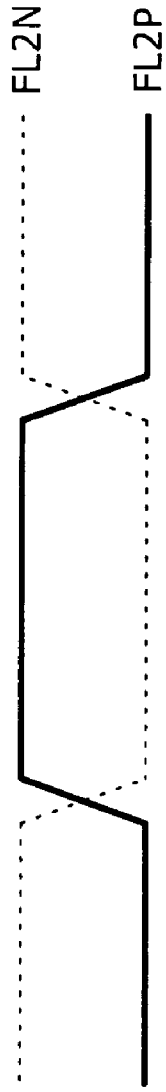
Figure 8C:
Figure 8D:

FIG. 8B shows an example of waveforms of the folding signal FL2. As shown in this figure, the polarity of the differential signal is inverted in the waveforms of the folding signal FL2 when the input voltage VIN coincides with the reference voltage Vr2 or Vr4.

The analog-to-digital conversion circuit shown in FIG. 6 is provided with the interpolating circuit 11 in a stage succeeding the folder circuit 9 that generates the folding signals FL1 and FL2 as described above.

On the basis of the folding signals FL1 and FL2 generated by the folder circuit 9, the interpolating circuit 11 generates interpolated folding signals INT2 and INT4 in which the polarity of the differential signals is inverted at levels of the input voltage VIN which levels are different from those of either of the folding signals FL1 and FL2.

In addition, the interpolating circuit 11 generates synthesized folding signals INT1 and INT3 in which the polarity of the differential signals is inverted at levels of the input voltage VIN which levels are equal to those of the folding signals FL1 and FL2, respectively.

For example, the interpolating circuit 11 generates the interpolated folding signals and the synthesized folding signals as described above as differential currents by giving predetermined weights to the folding signals FL1 and FL2 generated as differential currents in the folder circuit 9 and synthesizing the folding signals FL1 and FL2.

Figure 7:
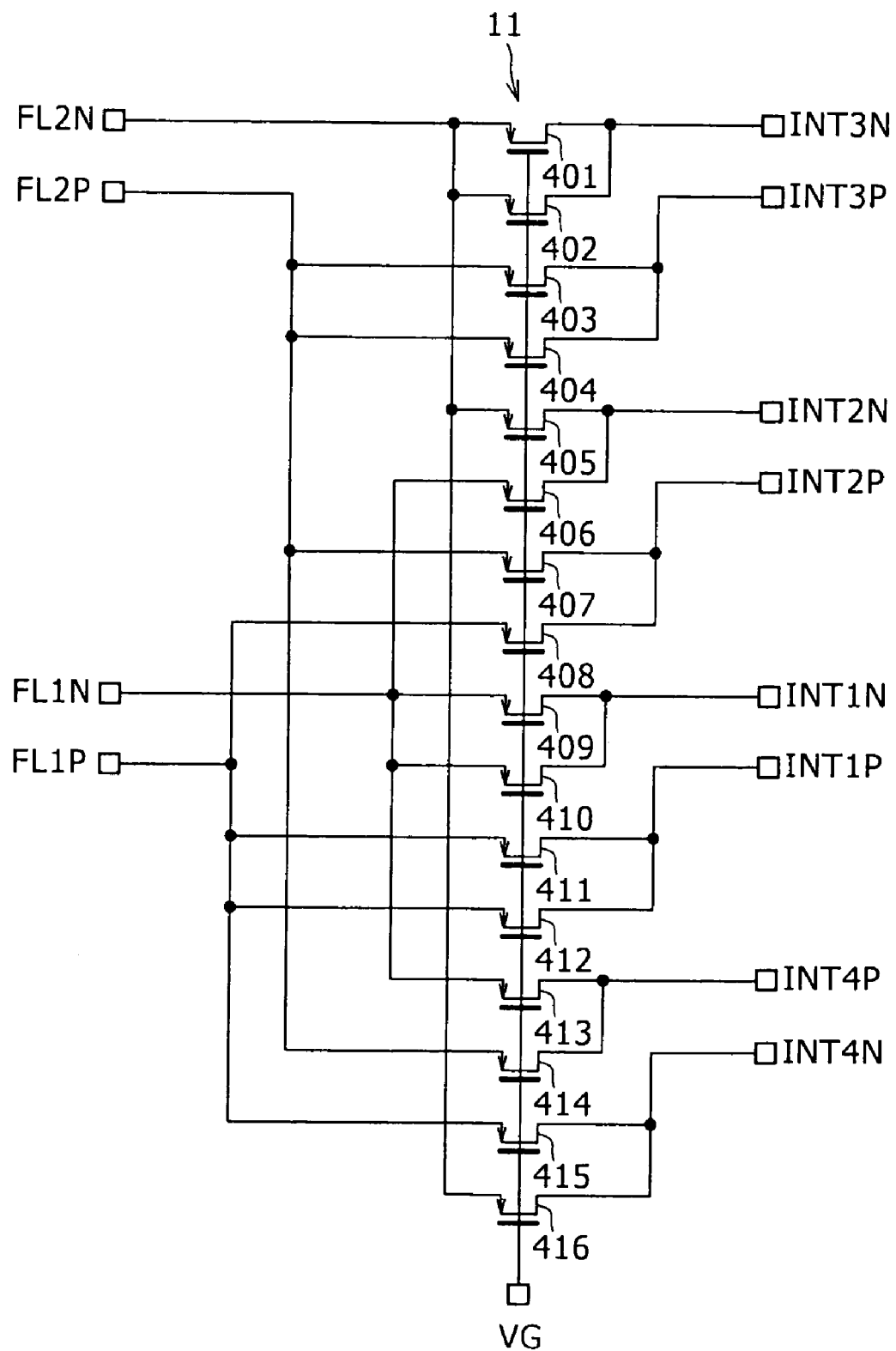
FIG. 7 is a diagram showing an example of configuration of an interpolating circuit.

FIG. 7 is a diagram showing an example of configuration of the interpolating circuit 11.

The interpolating circuit 11 shown in FIG. 7 has p-type MOS transistors 401 to 416.

In the following description, a symbol "P" or "N" attached to the rear of a symbol name of a differential signal represents one of a pair of two signals of the differential signal. For example, the signals forming the pair of the folding signal FL1 are represented by "FL1P" and "FL1N", respectively.

The folding signals (FL1P, FL1N, FL2P, and FL2N) generated in the folder circuit 9 are input to the source side of the p-type MOS transistors 401 to 416 as follows.

The sources of the MOS transistors 408, 411, 412, and 415 are connected to a common connection point. The current of the signal FL1P is input to the connection point.

The sources of the MOS transistors 406, 409, 410, and 413 are connected to a common connection point. The current of the signal FL1N is input to the connection point.

The sources of the MOS transistors 403, 404, 407, and 414 are connected to a common connection point. The current of the signal FL2P is input to the connection point.

The sources of the MOS transistors 401, 402, 405, and 416 are connected to a common connection point. The current of the signal FL2N is input to the connection point.

The interpolated folding signals INT2 and INT4 and the synthesized folding signals INT1 and INT3 are output from the drain side of the p-type MOS transistors 401 to 416 as follows.

The drains of the MOS transistors 401 and 402 are connected to a common connection point. The current of the signal INT3N is output from the connection point.

The drains of the MOS transistors 403 and 404 are connected to a common connection point. The current of the signal INT3P is output from the connection point.

The drains of the MOS transistors 405 and 406 are connected to a common connection point. The current of the signal INT2N is output from the connection point.

The drains of the MOS transistors 407 and 408 are connected to a common connection point. The current of the signal INT2P is output from the connection point.

The drains of the MOS transistors 409 and 410 are connected to a common connection point. The current of the signal INT1N is output from the connection point.

The drains of the MOS transistors 411 and 412 are connected to a common connection point. The current of the signal INT1P is output from the connection point.

The drains of the MOS transistors 413 and 414 are connected to a common connection point. The current of the signal INT4P is output from the connection point.

The drains of the MOS transistors 415 and 416 are connected to a common connection point. The current of the signal INT4N is output from the connection point.

FIGS. 8A, 8B, 8C, 8D, 8E, 8F, and 8G are diagrams showing an example of waveforms of the input and output signals of the interpolating circuit 11 shown in FIG. 7 and an output signal CAS1 of the coarse amplifier 10.

FIGS. 8A and 8B show an example of waveforms of the folding signals FL1 and FL2, respectively, generated in the folder circuit 9.

FIGS. 8C, 8D, 8E, and 8F show an example of waveforms of the folding signals INT1, INT2, INT3, and INT4, respectively, generated in the interpolating circuit 11.

Figure 8E:
Figure 8F:
Figure 8G:
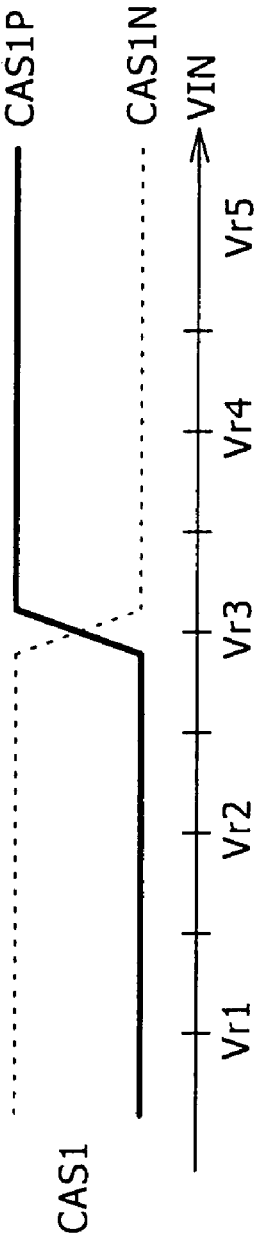

FIG. 8G shows an example of waveforms of the signal CAS1 amplified in the-coarse amplifier 10.

The interpolating circuit 11 shown in FIG. 7 outputs the folding signal FL1 as the folding signal INT1 without combining the folding signal FL1 with another signal. Therefore, as is understood by comparison of FIG. 8A with FIG. 8C, the folding signals FL1 and INT1 effect differential signal polarity inversion at equal input voltages VIN.

The same is true for the folding signals FL2 and INT3. The folding signals FL2 and INT3 effect differential signal polarity inversion at equal input voltages VIN (FIGS. 8B and 8E).

On the other hand, the folding signals INT2 and INT4 are generated by combining the folding signals FL1 and FL2 with each other. The folding signals INT2 and INT4 effect differential signal polarity inversion at input voltages VIN different from those of either of the folding signals FL1 and FL2. Specifically, the folding signal INT2 effects differential signal polarity inversion at a middle point between the reference voltages Vr1 and Vr2 and a middle point between the reference voltages Vr3 and Vr4. The folding signal INT4 effects differential signal polarity inversion at a middle point between the reference voltages Vr2 and Vr3 and a middle point between the reference voltages Vr4 and Vr5.

Description will return to FIG. 6.

The second averaging unit 5A is a circuit for reducing an offset occurring in the outputs of the interpolating circuit 11 by averaging the voltages of the folding signals INT1 to INT4 generated in the interpolating circuit 11 in an analog manner. The second averaging unit 5A has averaging resistive elements 510 to 513 and 520 to 523 for connection between output terminals of the interpolating circuit 11.

The averaging resistive elements 511 and 521 connect the output terminals of the same polarity for the folding signals INT1 and INT2 with each other. That is, the averaging resistive elements 511 and 521 connect the output terminals for the signals INT1P and INT2P with each other, and connect the output terminals for the signals INT1N and INT2N with each other.

The averaging resistive elements 512 and 522 connect the output terminals of the same polarity for the folding signals INT2 and INT3 with each other. That is, the averaging resistive elements 512 and 522 connect the output terminals for the signals INT2P and INT3P with each other, and connect the output terminals for the signals INT2N and INT3N with each other.

The averaging resistive elements 513 and 523 connect the output terminals of the same polarity for the folding signals INT3 and INT4 with each other. That is, the averaging resistive elements 513 and 523 connect the output terminals for the signals INT3P and INT4P with each other, and connect the output terminals for the signals INT3N and INT4N with each other.

The averaging resistive elements 510 and 520 connect the output terminals of opposite polarities for the folding signals INT1 and INT4 with each other. That is, the averaging resistive elements 510 and 520 connect the output terminals for the signals INT1P and INT4N with each other, and connect the output terminals for the signals INT1N and INT4P with each other.

As in the above-described case, by connecting the adjacent output terminals for the folding signals INT1 to INT4 with each other by the averaging resistive elements (511 to 513 and 521 to 523), it is possible to average and reduce an offset voltage in the outputs of the interpolating circuit 11, which offset voltage is caused by an element mismatch or the like, in an analog manner. In addition, the resistive elements 510 and 520 for connecting the output terminals of opposite polarities at both ends of the averaging resistive element part with each other can suppress a decrease in conversion accuracy more effectively.

The comparing unit 6A compares each pair of signals of the output signal CAS1 of the coarse amplifier 10 and the folding signals INT1 to INT4 of the interpolating circuit 11 with each-other, and then outputs a five-bit binary signal corresponding to a result of the comparison.

The comparing unit 6A has master comparator latches (MCLs) 61 to 65, for example. The MCLs 61 to 65 compare each pair of signals of the output signal CAS1 and the folding signals INT1 to INT4 with each other in synchronism with a clock signal CKA, and retains (latches) a binary signal corresponding to a result of the comparison.

Figure 9:
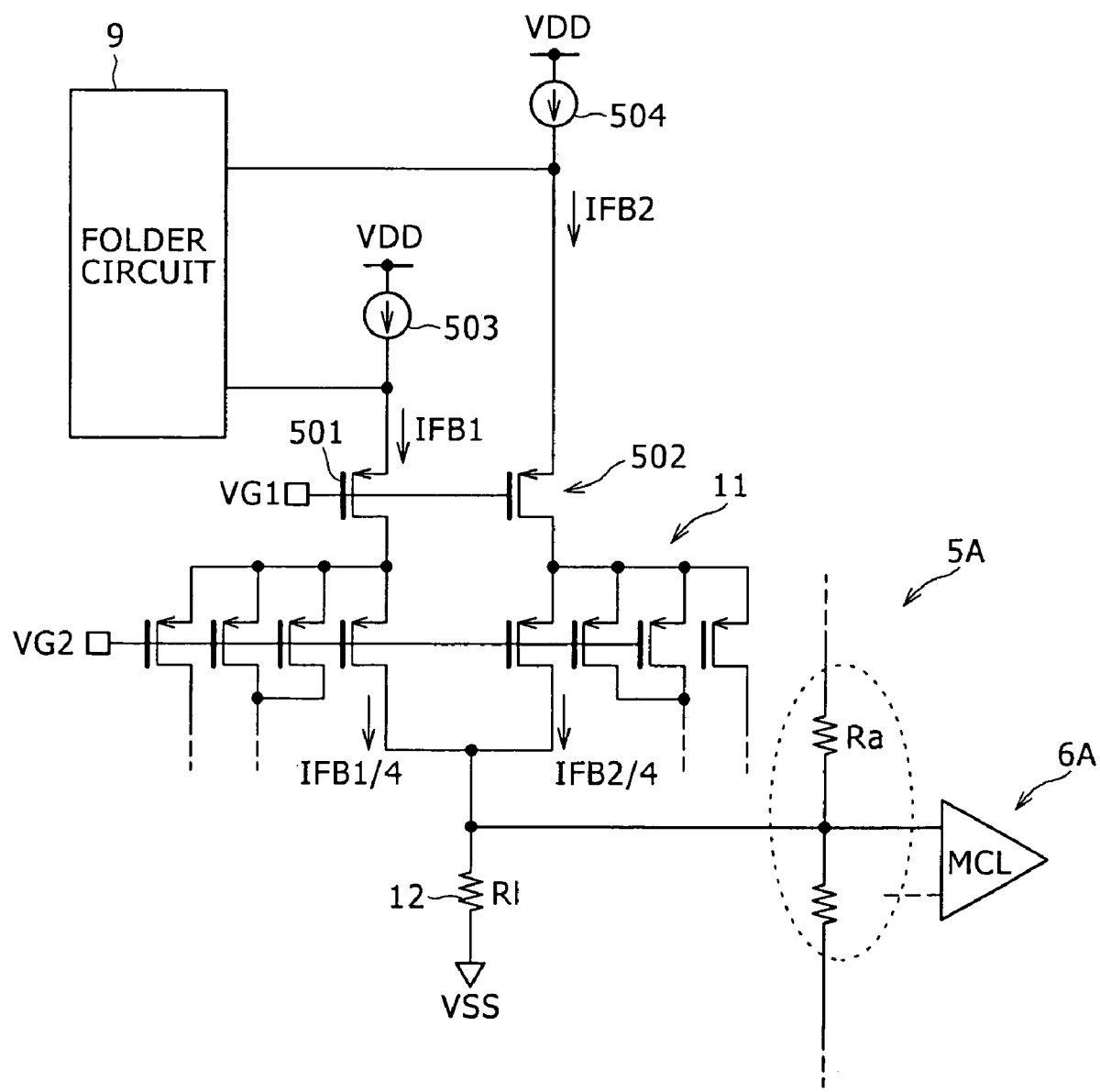
FIG. 9 is a diagram of assistance in explaining a circuit of a signal path from a folder circuit to a comparing unit.

FIG. 9 is a diagram of assistance in explaining a circuit of a signal path from the folder circuit 9 to the comparing unit 6A.

The folding signals FL1 and FL2 generated in the folder circuit 9 are combined with currents of constant-current circuits 503 and 504 connected to a power supply voltage VDD as shown in FIG. 9, for example, and then input to the interpolating circuit 11 via a cascode circuit of MOS transistors 501 and 502.

A resistive element 12 for current-to-voltage conversion, for example, is connected between the output of the interpolating circuit 11 and a reference potential VSS. A voltage generated in the resistive element 12 is input to the comparing unit 6A via the second averaging unit 5A.

Letting "Rl" be the resistance value of the resistive element 12 and "Ra" be the resistance value of an averaging resistive element in the second averaging unit 5A, an excellent offset reducing effect is obtained when a ratio between the resistance values (Ra/Rl) is set to about "0.1".

Figure 10:
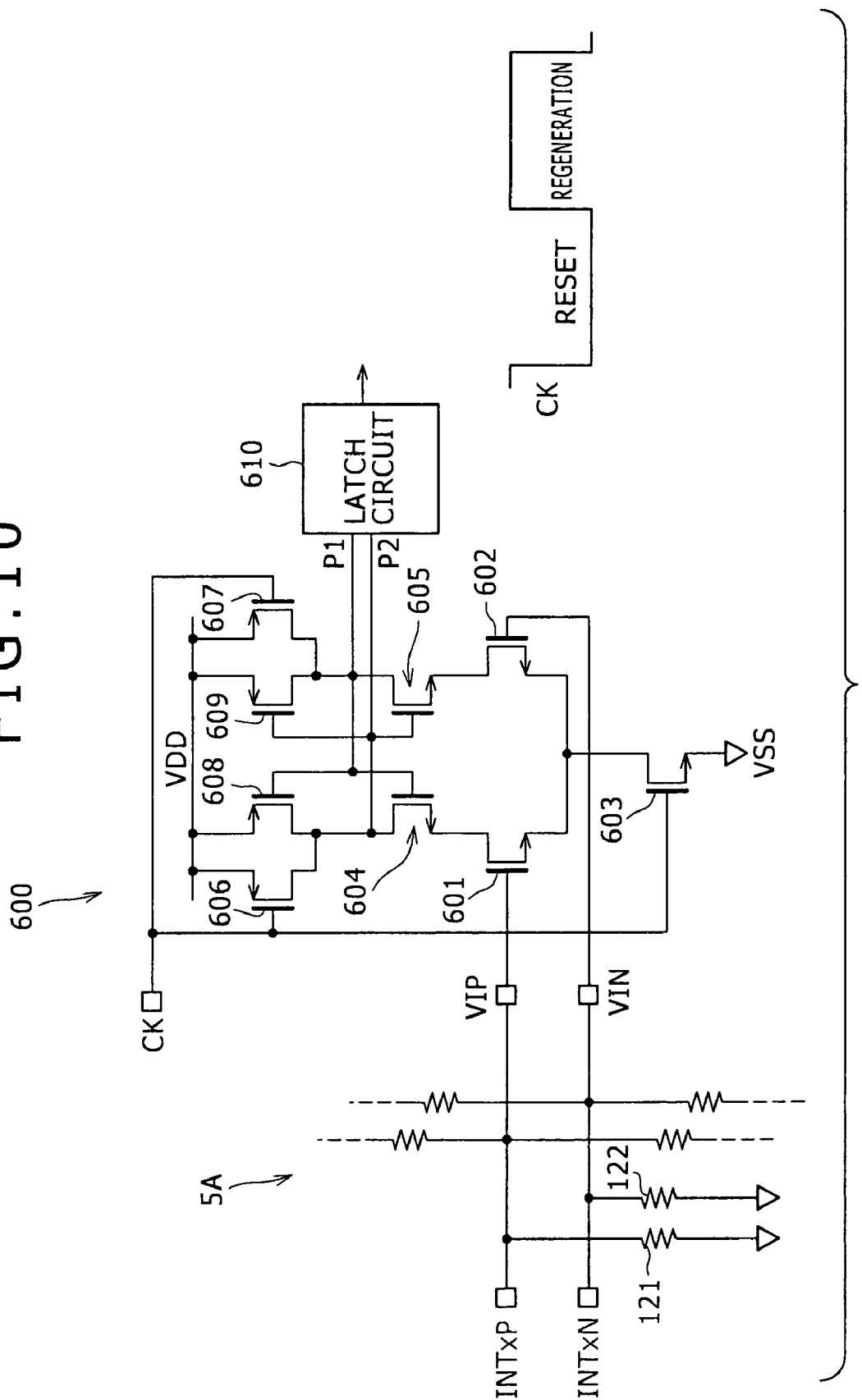
FIG. 10 is a diagram showing an example of configuration of a master comparator latch (MCL)

FIG. 10 is a diagram showing an example of configuration of the MCLs 61 to 65. FIG. 10 shows an example of a configuration having a comparator 600 of a differential voltage input type. The MCL shown in FIG. 10 has the comparator 600 and a latch circuit 610.

In the example of FIG. 10, in a stage preceding the comparator 600, resistive elements 121 and 122 for current-to-voltage conversion convert the differential current of a folding signal (INT1 to INT4) output from the interpolating circuit 11 into differential voltage. The comparator 600 compares a pair of voltages of the differential voltage with each other in a high-level period of a clock signal CK, and then outputs a binary signal as a result of the comparison to the latch circuit 610. The latch circuit 610 latches the binary signal as the result of the comparison which signal is output from the comparator 600 in synchronism with the clock signal CK.

The comparator 600 shown in FIG. 10 has n-type MOS transistors 601 to 605 and p-type MOS transistors 606 to 609.

The sources of the MOS transistors 601 and 602 are connected to a common connection point. The connection point is connected to the reference potential VSS via the MOS transistor 603.

The sources of the MOS transistors 606 to 609 are connected to a common power supply voltage VDD. The drains of the MOS transistors 606 and 608 are connected to the drain of the MOS transistor 604. The drains of the MOS transistors 607 and 609 are connected to the drain of the MOS transistor 605.

The differential voltage from the interpolating circuit 11 is input between the gates of the MOS transistors 601 and 602. The clock signal CK is input to the gates of the MOS transistors 603, 606, and 607.

The gates of the MOS transistors 608 and 604 are connected to the common drain of the MOS transistor 605.

The gates of the MOS transistors 609 and 605 are connected to the common drain of the MOS transistor 604.

The latch circuit 610 latches a differential voltage occurring between the drains of the MOS transistors 604 and 605 in synchronism with the clock signal CK.

In the comparator 600 shown in FIG. 10, when the clock signal CK is at a low level, the MOS transistor 603 is off, and the MOS transistors 606 and 607 are on, so that the drains of the MOS transistors 604 and 605 are both connected to the power supply voltage VDD. Therefore an operation of comparing differential input voltages is not performed.

When the clock signal CK is changed from the low level to a high level, the MOS transistors 606 and 607 are turned off, and the MOS transistor 603 is turned on. Thereby a voltage difference between the gates of the MOS transistors 601 and 602 is amplified with a very high gain, and a differential voltage is generated between the drains of the MOS transistors 604 and 605.

Figure 11:
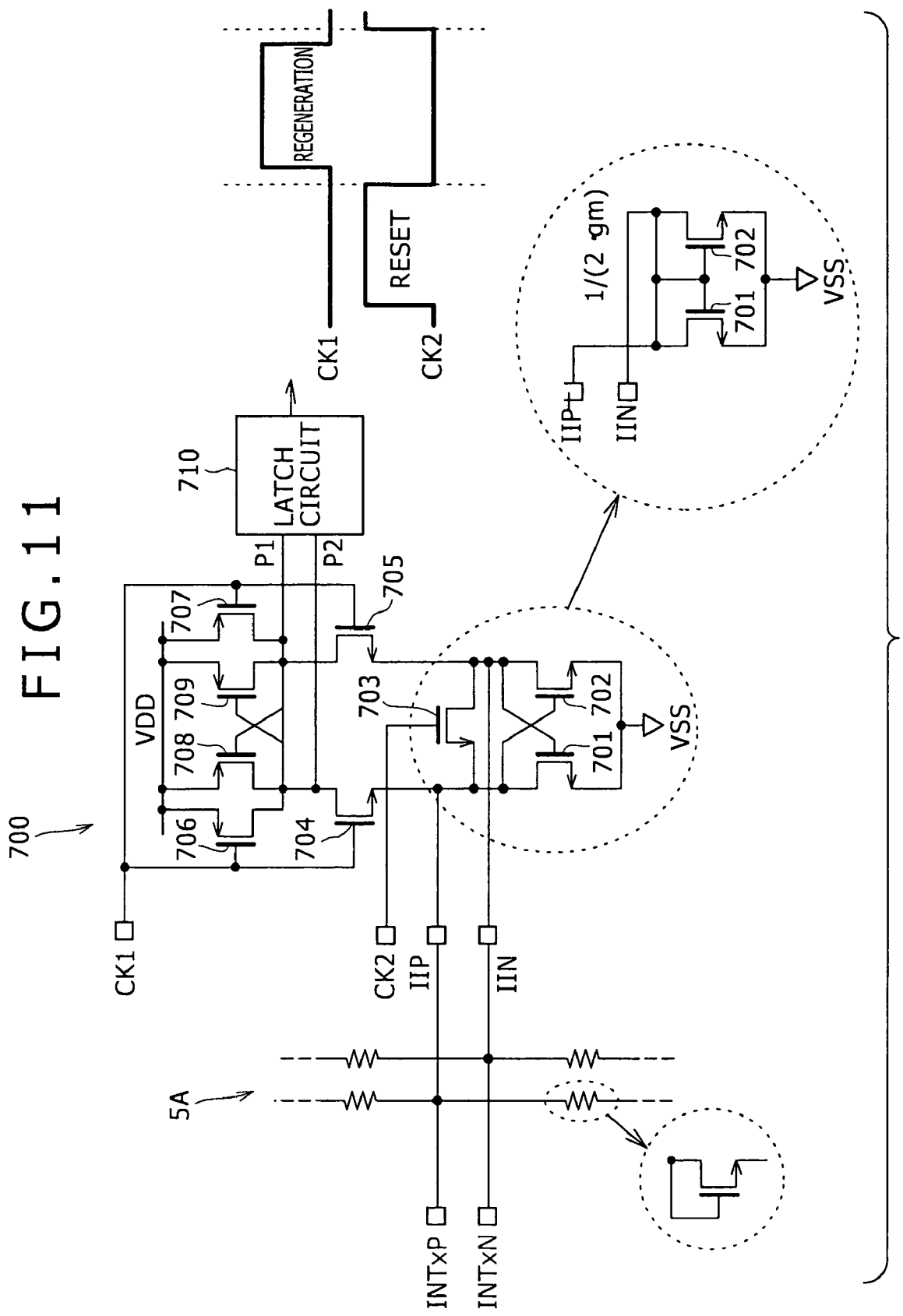
FIG. 11 is a diagram showing another example of configuration of a master comparator latch (MCL)

FIG. 11 is a diagram showing another example of configuration of the MCLs 61 to 65. FIG. 11 shows an example of a configuration having a comparator 700 of a type having a differential current directly input thereto from the interpolating circuit 11. The MCL shown in FIG. 11 has the comparator 700 and a latch circuit 710.

In the example of FIG. 11, the differential current of a folding signal (INT1 to INT4) output from the interpolating circuit 11 is directly input to the comparator 700. The comparator 700 compares a pair of currents of the differential current with each other in a high-level period of a clock signal CK1 (a low-level period of a clock signal CK2), and then outputs a binary signal as a result of the comparison to the latch circuit 710. The latch circuit 710 latches the binary signal as the result of the comparison which signal is output from the comparator 700 in synchronism with the clock signal CK1.

The comparator 700 shown in FIG. 11 has n-type MOS transistors 701 to 705 and p-type MOS transistors 706 to 709.

The sources of the MOS transistors 701 and 702 are connected to the reference potential VSS. The drain of the MOS transistor 701 is connected to the source of the MOS transistor 704. The gate of the MOS transistor 701 is connected to the drain of the MOS transistor 702. The drain of the MOS transistor 702 is connected to the source of the MOS transistor 705. The gate of the MOS transistor 702 is connected to the drain of the MOS transistor 701. The MOS transistor 703 is connected between the drains of the MOS transistors 701 and 702.

The sources of the MOS transistors 706 to 709 are connected to a common power supply voltage VDD. The drains of the MOS transistors 706 and 708 are connected to the drain of the MOS transistor 704. The drains of the MOS transistors 707 and 709 are connected to the drain of the MOS transistor 705.

The differential current from the interpolating circuit 11 is input between the drains of the MOS transistors 701 and 702. The clock signal CK1 is input to the gates of the MOS transistors 704 to 707. The clock signal CK2 is input to the gate of the MOS transistor 703.

The gate of the MOS transistor 708 is connected to the drain of the MOS transistor 705. The gate of the MOS transistor 709 is connected to the drain of the MOS transistor 704.

The latch circuit 710 latches a differential voltage occurring between the drains of the MOS transistors 704 and 705 in synchronism with the clock signal CK1.

The comparator 700 operates in response to the clock signals CK1 and CK2 of two systems controlled such that the high periods of the clock signals CK1 and CK2 do not coincide with each other. First, the comparator 700 is in a reset state during the high period of the clock signal CK2. That is, inputs IIP and IIN for the differential current from the interpolating circuit 11 are short-circuited by the MOS transistor 703, and a path from this input part to the power supply side is disconnected by the MOS transistors 704 and 705. At this time, the output terminals (P1 and P2) of the comparator 700 connected to the latch circuit 710 are connected to the power supply voltage VDD by the MOS transistors 706 and 707. Next, during the high period of the clock signal CK1, the MOS transistors 704 and 705 are in an on state, and the MOS transistors 703, 706, and 707 are in an off state, so that the differential current input from the inputs IIP and IIN is amplified. That is, positive feedback is performed so as to amplify a difference between the currents input to the inputs IIP and IIN, and a result of comparison is output as a differential voltage from the output terminals (P1 and P2).

The input impedance of the comparator 700 as viewed from the inputs IIP and IIN during a reset period during which the clock signal CK2 is at a high level can be expressed as "$1/(2 \cdot gm)$", where "gm" denotes a voltage/current amplification factor of the MOS transistors 701 and 702. When a ratio between the input impedance and the resistance value Ra of an averaging resistive element in the second averaging unit 5A is set to about "0.1", the above-described excellent offset reducing effect can be obtained.

Incidentally, the averaging resistive element does not need to be a passive element, and similar effect can be produced when the passive element is replaced with an active element such as a transistor or the like.

Description will return to FIG. 6.

The third averaging unit 7A subjects each of the binary signals output from the MCLs 61 to 64 of the comparing unit 6A to an averaging process by majority logic operation with two other binary signals.

The third averaging unit 7A in the example of FIG. 6 has four majority logic circuits 71 to 74. The majority logic circuit 71 performs majority logic operation on the two binary signals output from the MCLs 61 and 62 (the binary signal output from the MCL 61 is regarded as two signals). The majority logic circuit 72 performs majority logic operation on the three binary signals output from the MCLs 61 to 63. The majority logic circuit 73 performs majority logic operation on the three binary signals output from the MCLs 62 to 64. The majority logic circuit 74 performs majority logic operation on the two binary signals output from the MCLs 63 and 64 (the binary signal output from the MCL 64 is regarded as two signals).

The encoding unit 8 converts a four-bit binary signal resulting from the averaging process by majority logic in the third averaging unit 7A and a binary signal output from the MCL 65 in the comparing unit 6A into a three-bit digital signal.

As in the first embodiment, the analog-to-digital conversion circuit according to the present embodiment having the above-described configuration can effectively reduce an offset by the averaging circuits in three stages formed by the first averaging unit 3A, the second averaging unit 5A, and the third averaging unit 7A. It is therefore possible to achieve a smaller area and lower power consumption.

In addition, the number of circuit elements such as comparators and the like can be greatly reduced by the folder circuit 9 and the interpolating circuit 11. It is therefore possible to reduce circuit area and power consumption more effectively.

While some embodiments of the present invention have been described above, the present invention is not limited to the foregoing embodiments, and is susceptible of various changes.

In the example of the amplifier circuit shown in FIG. 3, an impedance ratio (Ra/Ro=0.1) suitable for averaging can be achieved by adjusting the element constants of the transistors and the current values of the constant-current circuits at a time of manufacturing. However, a circuit for adjusting the impedance ratio may be provided separately.

Figure 12:
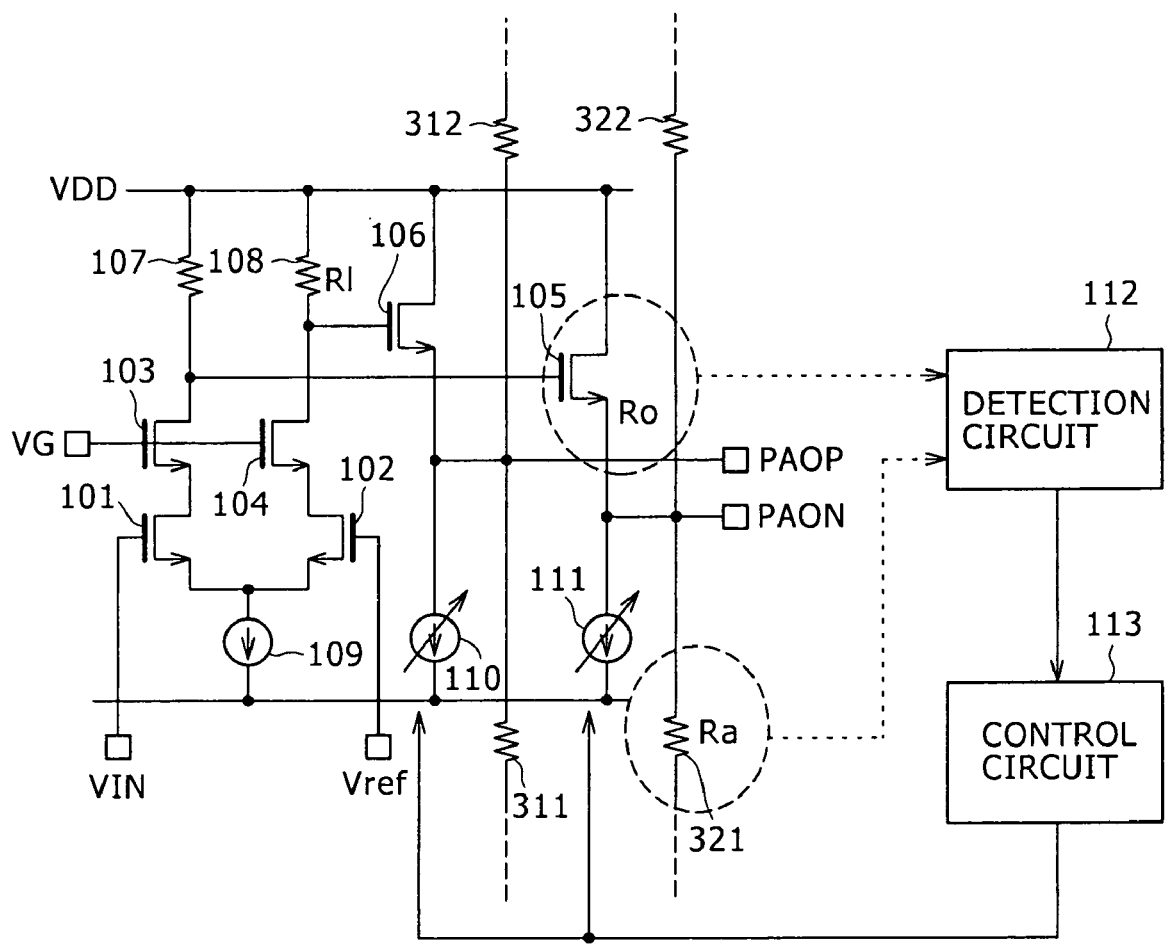
FIG. 12 is a diagram showing an example in which an impedance ratio controlling circuit is provided within an amplifier circuit.
Figure 13:
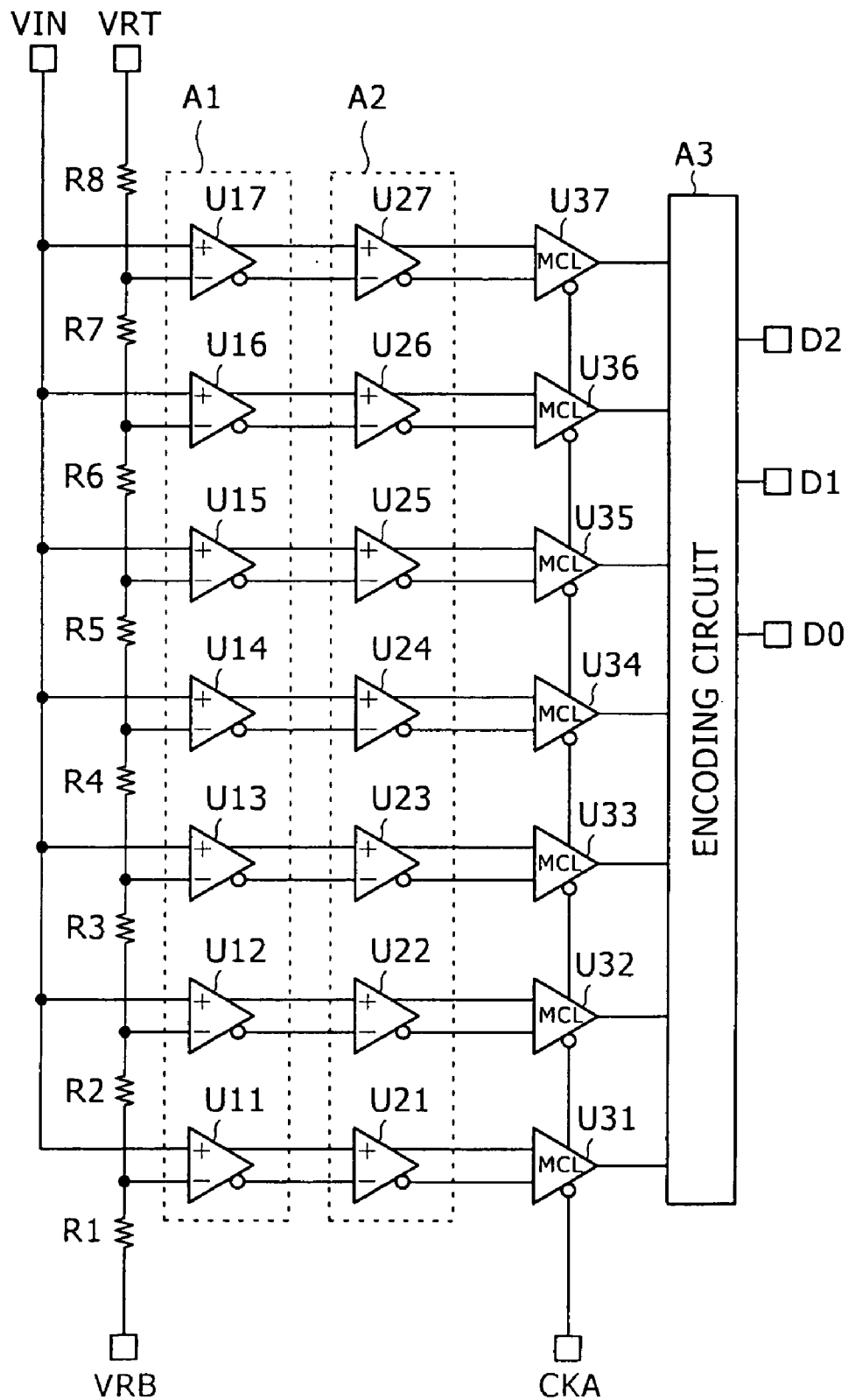
FIG. 13 is a diagram showing an example of configuration of an ordinary parallel type analog-to-digital conversion circuit.

FIG. 12 is a diagram showing an example of the circuit. A detection circuit 112 for outputting a detection signal corresponding to the impedance ratio (Ra/Ro) and a control circuit 113 for controlling currents flowing through constant-current circuits 110 and 111 according to the detection signal are provided within an amplifier circuit.

In the foregoing embodiments, an example of a three-bit converter has been described. However, the present invention is not limited to the configuration of a three-bit converter, and is applicable to converters for four or more bits.

In the foregoing embodiment, an example of performing signal interpolation by combining currents in the interpolating circuit 11 is cited. However, the present invention is not limited to this, and signal interpolation by voltage may be performed by voltage division using resistances, for example.

It should be understood by those skilled in the art that various modifications, combinations, sub-combinations and alterations may occur depending on designs and other factors insofar as-they are within the scope of the appended claims or the equivalents thereof.

What is claimed is:

1. An analog-to-digital conversion circuit configured to convert an input analog signal into a digital signal, said analog-to-digital conversion circuit comprising:
   a first amplifying unit configured to amplify each of level differences between said analog signal and a plurality of reference signals, and outputting a plurality of differential signals corresponding to a result of the amplification;

a second amplifying unit configured to amplify each of the plurality of differential signals output from said first amplifying unit, and outputting a plurality of differential signals corresponding to a result of the amplification;

a comparing unit configured to compare each pair of signals of the plurality of differential signals output from said second amplifying unit with each other, and outputting a plurality of binary signals corresponding to a result of the comparison;

a first averaging unit including a plurality of averaging resistive elements configured to connect between output terminals of said first amplifying unit;

a second averaging unit including a plurality of averaging resistive elements configured to connect between output terminals of said second amplifying unit; and a third averaging unit configured to perform an averaging process by majority logic operation on each of the plurality of binary signals output from said comparing unit with a predetermined number of other binary signals, wherein at least one of said first amplifying unit and said second amplifying unit includes:

a differential amplifier circuit configured to amplify an input differential signal; and a voltage follower circuit to which the differential signal output from said differential amplifier circuit is input, and which outputs a differential voltage corresponding to a voltage difference of the input differential signal to said output terminal.

2. The analog-to-digital conversion circuit as claimed in claim 1, wherein an impedance ratio between an output impedance of said voltage follower circuit and a resistance value of a said resistive element connected to said voltage follower circuit via said output terminal has a predetermined value.

3. The analog-to-digital conversion circuit as claimed in claim 2, wherein said voltage follower circuit includes:

a first transistor supplied with one of a pair of signals of the differential signal output from said differential amplifier circuit as a control signal;

a second transistor supplied with another of the pair of signals of the differential signal output from said differential amplifier circuit as a control signal;

a first constant-current circuit connected to said first transistor; and a second constant-current circuit connected to said second transistor;

wherein a difference between a voltage generated at a point of connection between said first transistor and said first constant-current circuit and a voltage generated at a point of connection between said second transistor and said second constant-current circuit is output as differential voltage to said output terminal, and said first constant-current circuit and said second constant-current circuit generate a constant current adjusted such that said impedance ratio has said predetermined value.

4. The analog-to-digital conversion circuit as claimed in claim 3, further comprising:

a detection circuit configured to output a detection signal corresponding to said impedance ratio; and a control circuit configured to control the currents flowing through said first constant-current circuit and said second constant-current circuit according to said detection signal.

5. An analog-to-digital conversion circuit configured to convert an input analog signal into a digital signal, said analog-to-digital conversion circuit comprising:

a first amplifying unit configured to amplify each of level differences between said analog signal and a plurality of reference signals, and outputting a plurality of differential signals corresponding to a result of the amplification;

a second amplifying unit configured to amplify each of the plurality of differential signals output from said first amplifying unit, and outputting a plurality of differential signals corresponding to a result of the amplification;

a comparing unit configured to compare each pair of signals of the plurality of differential signals output from said second amplifying unit with each other, and outputting a plurality of binary signals corresponding to a result of the comparison;

a first averaging unit including a plurality of averaging resistive elements configured to connect between output terminals of said first amplifying unit;

a second averaging unit including a plurality of averaging resistive elements configured to connect between output terminals of said second amplifying unit; and a third averaging unit configured to perform an averaging process by majority logic operation on each of the plurality of binary signals output from said comparing unit with a predetermined number of other binary, wherein said second amplifying unit includes:

a first differential amplifier circuit configured to amplify at least one differential signal of said first amplifying unit which signal is related to a predetermined high-order bit of said digital signal;

a folder circuit including a plurality of second differential amplifier circuits configured to amplify at least a part of the plurality of differential signals output from said first amplifying unit, said folder circuit generating a plurality of folding signals in which differential signal polarity inversion occurs at different levels of said analog signal, by synthesizing differential signals output from said plurality of second differential amplifier circuits in predetermined combinations; and an interpolating circuit configured to generate at least one interpolated folding signal in which differential signal polarity inversion occurs at levels of said analog signal which levels are different from the levels at which the differential signal polarity inversion occurs in all of said plurality of folding signals, on a basis of the plurality of folding signals generated by said folder circuit;

wherein said comparing unit compares each pair of signals of a differential signal output from said first differential amplifier circuit, said plurality of folding signals, and said interpolated folding signal with each other, and outputs a plurality of binary signals corresponding to a result of the comparison.

6. The analog-to-digital conversion circuit as claimed in claim 5, wherein said folder circuit generates each of said plurality of folding signals as differential current; and said interpolating circuit generates said interpolated folding signal as differential current by giving a predetermined weight to each of said plurality of folding signals generated as differential currents in said folder circuit and synthesizing said plurality of folding signals.

7. The analog-to-digital conversion circuit as claimed in claim 6, wherein said comparing unit compares a pair of currents of said interpolated folding signal generated as differential current with each other, and outputs a binary signal corresponding to a result of the comparison.

8. The analog-to-digital conversion circuit as claimed in claim 6, further comprising a current-to-voltage conversion circuit configured to convert said interpolated folding signal generated as differential current into differential voltage, wherein said comparing unit compares a pair of voltages of the differential voltage converted in said current-to-voltage conversion circuit with each other, and outputs a binary signal corresponding to a result of the comparison.

9. The analog-to-digital conversion circuit as claimed in claim 5, wherein said interpolating circuit generates a plurality of synthesized folding signals in which differential signal polarity inversion occurs at levels of said analog signal which levels are equal to the levels at which the differential signal polarity inversion occurs in said plurality of folding signals, and said comparing unit is supplied with said plurality of synthesized folding signals as said plurality of folding signals, and outputs binary signals corresponding to said plurality of synthesized folding signals.

10. An analog-to-digital conversion circuit configured to convert an input analog signal into a digital signal, said analog-to-digital conversion circuit comprising:

a first amplifying unit configured to amplify each of level differences between said analog signal and a plurality of reference signals, and outputting a plurality of differential signals corresponding to a result of the amplification;

a second amplifying unit configured to amplify each of the plurality of differential signals output from said first amplifying unit, and outputting a plurality of differential signals corresponding to a result of the amplification;

a comparing unit configured to compare each pair of signals of the plurality of differential signals output from said second amplifying unit with each other, and outputting a plurality of binary signals corresponding to a result of the comparison;

a first averaging unit including a plurality of averaging resistive elements configured to connect between output terminals of said first amplifying unit;

a second averaging unit including a plurality of averaging resistive elements configured to connect between output terminals of said second amplifying unit; and a third averaging unit configured to perform an averaging process by majority logic operation on each of the plurality of binary signals output from said comparing unit with a predetermined number of other binary, wherein the averaging resistive elements of said first averaging unit connect adjacent output terminals to each other in a sequence when a plurality of the output terminals of said first amplifying unit are ordered according to levels of said analog signal at which levels polarity of differential signals of the outputs is inverted, and the averaging resistive elements of said second averaging unit connect adjacent output terminals to each other in a sequence when a plurality of the output terminals of said second amplifying unit are ordered according to levels of said analog signal at which levels polarity of differential signals of the outputs is inverted.

11. An analog-to-digital conversion circuit configured to convert an input analog signal into a digital signal, said analog-to-digital conversion circuit comprising:

a first amplifying unit configured to amplify each of level differences between said analog signal and a plurality of reference signals, and outputting a plurality of differential signals corresponding to a result of the amplification;

a second amplifying unit configured to amplify each of the plurality of differential signals output from said first amplifying unit, and outputting a plurality of differential signals corresponding to a result of the amplification;

a comparing unit configured to compare each pair of signals of the plurality of differential signals output from said second amplifying unit with each other, and outputting a plurality of binary signals corresponding to a result of the comparison;

a first averaging unit including a plurality of averaging resistive elements configured to connect between output terminals of said first amplifying unit;

a second averaging unit including a plurality of averaging resistive elements configured to connect between output terminals of said second amplifying unit; and a third averaging unit configured to perform an averaging process by majority logic operation on each of the plurality of binary signals output from said comparing unit with a predetermined number of other binary, wherein said third averaging unit performs majority logic operation on each set of a predetermined number of adjacent binary signals in a sequence when the plurality of binary signals of said comparing unit are ordered according to levels of said analog signal at which levels the plurality of binary signals are logically inverted.

* * * * *

UNITED STATES PATENT AND TRADEMARK OFFICE
CERTIFICATE OF CORRECTION

PATENT NO. : 7,405,691 B2 Page 1 of 1
APPLICATION NO. : 11/648544
DATED : July 29, 2008
INVENTOR(S) : Kiyoshi Makigawa et al.

It is certified that error appears in the above-identified patent and that said Letters Patent is hereby corrected as shown below:

Column 18, Line 27:
"binary," should read -- binary signals, --.

Column 20, Line 2:
"binary," should read -- binary signals, --.

Column 20, Line 41:
"binary," should read -- binary signals, --.

Signed and Sealed this

Thirtieth Day of September, 2008

JON W. DUDAS
*Director of the United States Patent and Trademark Office*